United States Patent [19]

Qualich

[11] Patent Number: 5,793,127
[45] Date of Patent: Aug. 11, 1998

[54] INDUCTIVE LOAD DRIVER CIRCUIT WITH SHARED FLYBACK PROTECTION

[75] Inventor: John R. Qualich, Buffalo Grove, Ill.

[73] Assignee: Motorola Inc., Schaumburg, Ill.

[21] Appl. No.: 691,719

[22] Filed: Aug. 2, 1996

[51] Int. Cl.[6] .................................................. H02H 3/00
[52] U.S. Cl. .......................... 307/125; 307/116; 361/152; 361/154; 327/108; 327/110; 327/180; 327/329
[58] Field of Search .............................. 307/125, 116; 361/152, 154, 143; 327/110, 108, 139, 180, 304, 321; 326/30

[56] References Cited

U.S. PATENT DOCUMENTS

| | | | |
|---|---|---|---|
| 3,947,776 | 3/1976 | Stevens et al. | 327/374 |
| 4,234,903 | 11/1980 | Harper | 361/154 |
| 4,400,756 | 8/1983 | Cave et al. | 361/152 |
| 5,047,662 | 9/1991 | Edwards | 327/110 |
| 5,523,632 | 6/1996 | Seragnoli | 307/125 |

*Primary Examiner*—William M. Shoop, Jr.
*Assistant Examiner*—Albert W. Paladini
*Attorney, Agent, or Firm*—Nicholas C. Hopman

[57] ABSTRACT

An inductive load driver circuit with shared flyback protection includes a first transistor (209) which drives a first load (229), and a second transistor (231) drives a second load (251). A first clamp voltage steering diode (217) is coupled between an input terminal (207) of the first transistor (209) and a zener diode (203), and a second clamp voltage steering diode (239) coupled between an input terminal (233) of the second transistor (231) and the zener diode (203). A power supply terminal (201) is coupled to the zener diode (203).

22 Claims, 3 Drawing Sheets

INDUCTIVE LOAD DRIVER CIRCUIT WITH SHARED FLYBACK PROTECTION

FIELD OF THE INVENTION

This invention is related to the field of semiconductors and more particularly to protection of transistor based inductive load drivers.

BACKGROUND OF THE INVENTION

Transistor drivers that drive inductive loads need to be protected from excessive voltage occurring during turn-off of the inductive load, often referred to as the 'flyback' event. This is commonly accomplished by limiting a rate at which a transistor driver turns off, specifically the rate of change of load current vs. time during turn-off (dI/dT). The dI/dT is limited to a rate that prevents excessive voltage from building across the transistor's drain to its source, in the case of a field effect transistor.

A typical prior art circuit is shown in FIG. 1. A transistor driver circuit 100 includes a field effect transistor 101 that provides drive to an inductive load 103 from a voltage source 105 dependent on a drive signal, provided at a terminal 122, coupled to a gate 107 of the field effect transistor 101. While the inductive load 103 is being actively driven, a magnitude of voltage measurable across the inductive load 103 is essentially equal to a magnitude of the voltage provided by the voltage source 105, while drive current flows through along a path 120 including the field effect transistor 101 and through the inductive load 103. When the drive signal present at terminal 122 commands the field effect transistor 101 to decrease the magnitude of drive current conducting through the inductive load 103, the inductive action of the inductive load 103 acts to maintain the drive current in the inductive load 103, causing a negative voltage to build across the inductive load 103. This voltage across the inductive load 103 can be calculated using the following equation:

$$V = L*(dI/dT),$$

where:

L is the inductance of the load

I is current passing through the load;

T is time; and

V is voltage resulting from the change in current (I) vs. time (T)

Since the inductive load 103 is connected to a ground terminal 111, the voltage across the inductive load 103 has a magnitude equal to the magnitude of the voltage at a source 199 of the field effect transistor 101. As the voltage rapidly builds across the inductive load 103, the voltage at the source 199 of the field effect transistor 101 rapidly transitions negative. The voltage at the gate 107 follows the voltage at the source 199 of the field effect transistor 101 because a voltage across the gate to source capacitor 113 cannot change instantly. The voltage source 105 is typically 12 volts potential in an automotive system. When the voltage at the gate 107 is low enough to forward bias a zener diode 117 and a diode 115, current will flow through the zener diode 117 and the diode 115, limiting the voltage difference between the voltage source 105 and the gate 107. At this point, any decrease in voltage at the source 199 of the field effect transistor 101 will increase the voltage gate-source 121 (the voltage measured between the gate 107 and the source 199 terminals of the field effect transistor 101). Any increase in voltage gate-source 121 will tend to increase current through the field effect transistor 101 and the inductive load 103. Thus a feedback system is formed a decrease in current through the field effect transistor 101 and inductive load 103 will tend to decrease the voltage at the source 199 and increase the voltage gate-source 121. But, this increase in voltage of voltage gate-source 121 tends to increase current through the field effect transistor 101 and the inductive load 103. Because of the high transconductance of the field effect transistor 101, the net result is that the voltage at the source 199 will not go more than a few volts below the voltage at a drain 198 of the field effect transistor 101 minus the zener diode's 117 breakdown voltage. For example, If the voltage source 105 is at 12 volts potential, and the zener diode 117 voltage is 28 volts, the diode 115 forward voltage is 0.6 volts and the voltage gate-source voltage 121 threshold is 5 volts, the voltage at the source 199 will be limited to −21.6 volts. The voltage from the drain 198 to source 199 of the field effect transistor 101 is limited to 33.6 volts.

Note that the diode 115 is in the circuit 100 to isolate the zener diode 117 from a circuit providing the drive signal at terminal 122, which is typically a charge-pump circuit used to elevate the voltage of the gate 107 to a magnitude sufficient enough to turn the field effect transistor 101 completely on. Without diode 115 the zener diode 117 would limit the voltage associated with the drive signal at the gate 107.

The above-described circuit generally performs adequately. However, for every individual driver stage deployed, the zener diode 117 and diode 115 need to be present. In control systems where many drivers are required this arrangement can not only be costly but unreliable and relatively physically large because of the need to include the zener diode 117 and diode 115 for every driver circuit.

What is needed is an improved circuit for driving inductive loads that is simpler, smaller, and more reliable.

DETAILED DESCRIPTION OF A PREFERRED EMBODIMENT

An inductive load driver circuit with shared flyback protection includes a first transistor that drives a first inductive load, and a second transistor that drives a second inductive load. A first clamp voltage steering diode is coupled between an input terminal of the first transistor and a zener diode, and a second clamp voltage steering diode is coupled between an input terminal of the second transistor and the zener diode. A power supply terminal is coupled to the zener diode for providing a clamp voltage.

Figure 1:
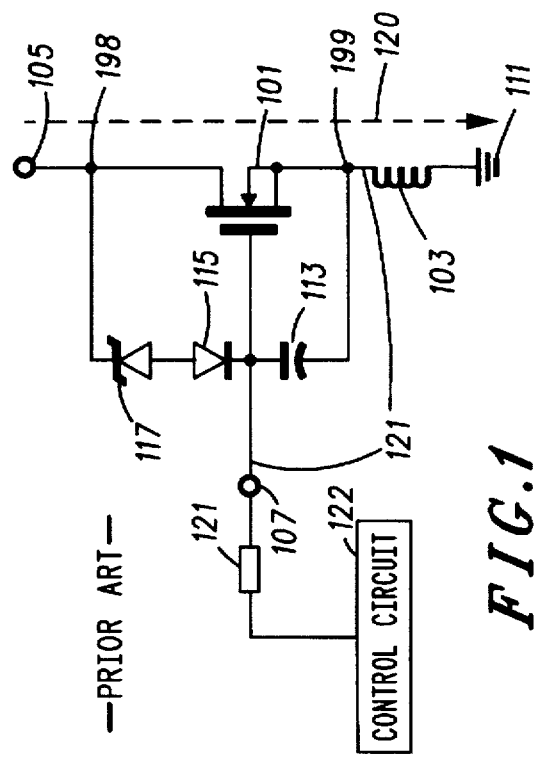
FIG. 1 is a schematic drawing of a prior art circuit for driving inductive loads while protecting against driver destruction.
Figure 2:
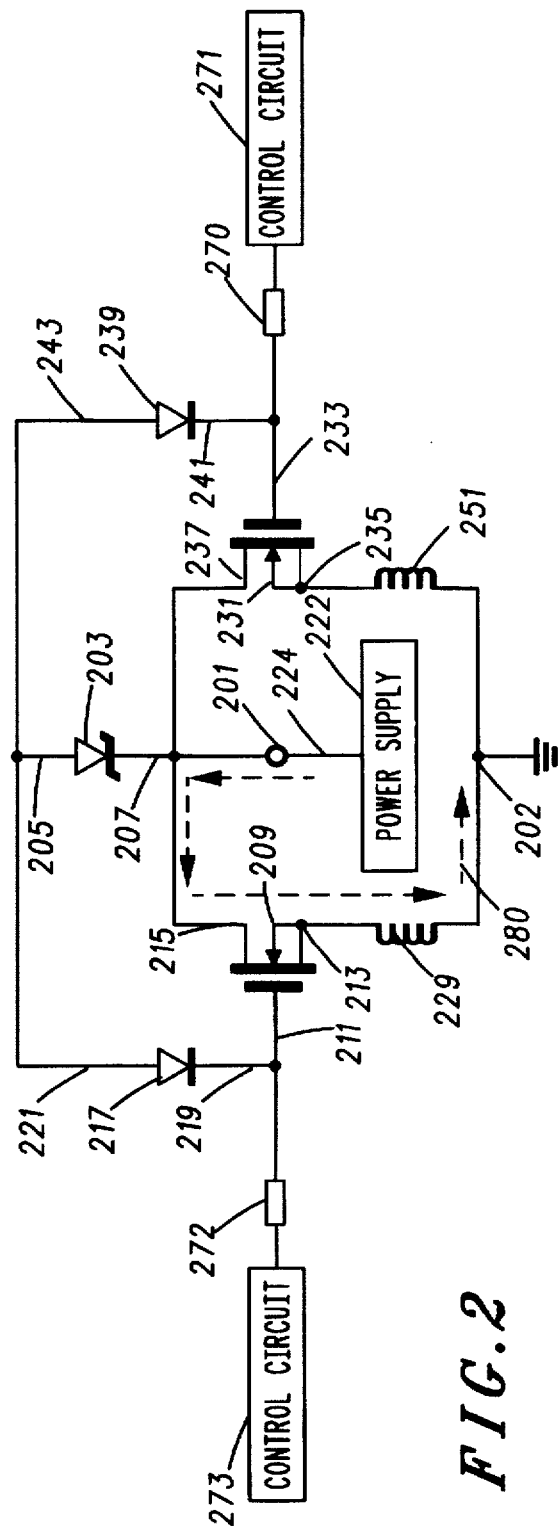
FIG. 2 is a schematic block diagram illustrating a driver circuit in accordance with an embodiment of the invention.

Note that FIG. 1 was described in the Background. FIG. 2 is a schematic block diagram illustrating a driver circuit 200 in accordance with an embodiment of the invention. Essentially, it shows a clamping circuit that is shared between transistor drivers rather than having separate clamping circuits to protect each of the transistor drivers separately. By adopting this structure, one can construct multiple load drivers that are less expensive, simpler, smaller, and more reliable.

A zener diode 203 has a cathode 207 that is connected to a power supply terminal 201. For the described application, the zener diode is a 28 volt device, and the power supply terminal 201 is powered by power supply 222 that outputs a voltage 224. In an automotive application the power supply can be the vehicle's 12 volt battery. Optionally, the power supply terminal 201 could be held to any other convenient voltage including zero volts.

A first transistor 209 includes an input terminal (gate) 211, a second terminal (source) 213, and a third terminal (drain) 215. A first clamp voltage steering diode 217 has a cathode 219 connected to the gate 211 of the first transistor 209, and an anode 221 connected to an anode 205 of the zener diode 203. A first inductive load 229 is connected between the source 213 of the first transistor 209 and a ground terminal 202.

A second transistor 231 includes an input terminal (gate) 233, a second terminal (source) 235, and a third terminal (drain) 237. A second clamp voltage steering diode 239 has a cathode 241 connected to the gate 233 of the second transistor 231, and an anode 243 connected to the anode 205 of the zener diode 203. A second inductive load 251 is connected between the source 235 of the second transistor 231 and the ground terminal 202. The first transistor 209 is controlled by a first control circuit 273 via a resistor 272, that is connected to the gate 211 of first transistor 209. The second transistor 231 is controlled by a second control circuit 271 via resistor 270, which is connected to the gate 233 of the second transistor 231.

When the first control circuit 273 provides a high voltage to the gate 211 of first transistor 209 through resistor 272, current will flow from power supply terminal 201 through the first transistor's drain 215 to the first transistor's source 213, through the inductive load 229, to ground 202 as shown by reference number 280.

When first control circuit 273 decreases voltage to the high voltage applied to the gate 211 of the first transistor 209 through resistor 272, the current 280 flowing from power supply terminal 201 through the first transistor's drain 215 to the first transistor's source 213, through the inductive load 229, to ground 202 will decrease. This will cause a voltage present across the inductive load 229 to decrease to a negative value. The voltage at the source 213 of the first transistor 209 will decrease, as will the voltage at the gate 211 of first transistor 209. The voltage at the gate 211 of first transistor 209 will decrease only to the level at which the zener diode 207 breaks down and the first clamp voltage steering diode 217 is forward biased.

As in the prior art circuit of FIG. 1 a feedback system is formed—a decrease in current 280 through the first transistor 209 and inductive load 229 will tend to decrease the voltage at the source 213 and increase the voltage between the gate 211 and source 213. But, this increase of voltage between the gate 211 and source 213 tends to increase current 280 through the first transistor 209 and the inductive load 229. Because of the high transconductance of the first transistor 209 the net result is that the voltage at the source 213 will not go more than a few volts below the voltage at the drain 215 minus the zener diode's 203 breakdown voltage.

What makes the circuit of FIG. 2 different from the circuit of FIG. 1 is the addition of the second transistor 231, load 251, and second clamp voltage steering diode 239. The voltage across the second transistor 231 is clamped by zener diode 203 and second clamp voltage steering diode 239 in the same manner that the first transistor 209 is clamped by zener diode 203 and first clamp voltage steering diode 221. The signal at the anode of zener diode 205 is 'shared' by each clamp voltage steering diode 217 and 239.

An advantage of the circuit of FIG. 2 is that fewer parts are required to suppress inductive flyback from multiple loads. For example only one zener diode is required to provide the clamping for two transistors. Additional clamp voltage steering diodes may be added to provide a clamp for additional transistors without the need to provide more zener diodes. For example, a circuit requiring eight transistors using the clamp method of FIG. 1 requires eight zener diodes and eight clamp voltage steering diodes. A circuit requiring eight transistors using the clamp method of FIG. 2 requires only one zener diode and eight clamp voltage steering diodes. Additionally, the common anode configuration of the two clamp voltage steering diodes 239 and 217 in FIG. 2 allows them to be combined, as a dual diode, in a popular three terminal package. In that case a circuit requiring eight transistors using the clamp method of FIG. 2 requires only one zener diode and four dual diodes.

Figure 3:
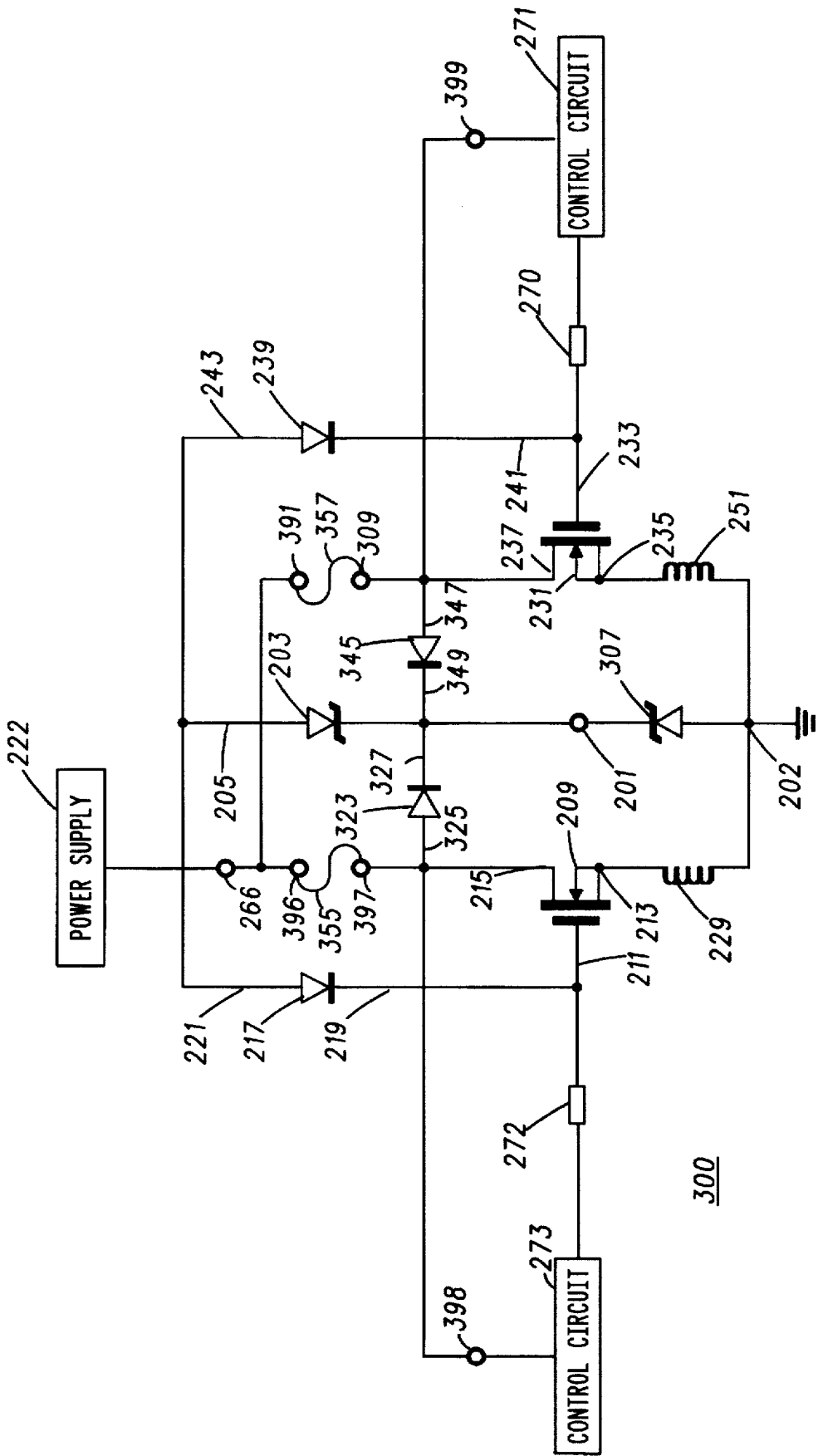
FIG. 3 is a schematic block diagram illustrating a driver circuit in accordance with another embodiment of the invention.

FIG. 3 is a schematic block diagram illustrating another driver circuit 300 in accordance with another embodiment of the invention. In this circuit, two fuses 355 and 357, protect a vehicle from excessive current due to inadvertent short circuits. The two fuses 355 and 357 provide power to two separate transistor drive circuits such that the opening of one fuse will not affect the operation of the circuitry powered by the other fuse. Additionally, protection against high voltage, high energy transients (automotive load-dump) is provided by surge suppressor 307. In a typical 12 volt battery driven automotive application, the surge suppression device 307 clamps voltages above about 28 volts. Power clamp diodes 323 and 345 provide isolation between the two fused circuits while allowing connection to surge suppressor 307. Zener diode 203 and clamp voltage steering diodes 217 and 239 provide clamping function for the first transistor 209 and the second transistor 231 in the same manner as in the circuit of FIG. 2.

A surge suppression device 307 is connected between the power supply terminal 201 and the ground terminal 202. A first power clamp diode 323 has an anode 325 connected to the drain 215 of the first transistor 209 and to an output terminal 397 of the first fuse 355.

A power terminal 398 of the first control circuit 273 is also connected to the output terminal 397 of the first fuse 355. A fuse input terminal 396 of the first fuse 355 connects to the power supply 222 which can be a vehicle's battery at terminal 266. The cathode 327 of first power clamp diode 323 connects to the power supply terminal 201. Power for the first control circuit 273 comes from power supply 222, through first fuse 355 and into power terminal 398 of first control circuit 273. Positive voltage transients on power terminal 398 of first control circuit 273 are clamped by first power clamp diode 323 and surge suppressor 307 to about 28.6 volts above ground 202.

A second power clamp diode 345 has an anode 347 connected to the drain 237 of the second transistor 231 and to the output terminal 390 of the second fuse 357. Power terminal 399 of the second control circuit 271 is also connected to output terminal 309 of second fuse 357. A fuse input terminal 391 of the second fuse 357 connects to the power supply 222. The cathode 349 of second power clamp diode 345 connects to the power supply terminal 201. Power for the second control circuit 271 comes from power supply 222, through second fuse 357 and into power terminal 399 of second control circuit 271. Positive voltage transients on power terminal 399 of second control circuit 271 are clamped by second power clamp diode 345 and surge suppressor 307 to about 28.6 volts above ground 202.

A first transistor 209 includes an input terminal gate 211, a source 213, and a drain 215 A first clamp voltage steering diode 217 has a cathode 219 connected to the gate 211 of the first transistor 209, and an anode 221 connected to the anode 205 of the zener diode 203. A first inductive load 229 is connected between the source 213 of the first transistor 209 and the ground terminal 202.

A second transistor 231 includes an input gate terminal 233, source 235, and drain 237. A second clamp voltage steering diode 239 has a cathode 241 connected to the gate 233 of the second transistor 231, and an anode 243 connected to the anode 205 of the zener diode 203. A second inductive load 251 is connected between the source 235 of the second transistor 231 and the ground terminal 202. First transistor 209 is controlled by first controlled by circuit 273 trough resistor 272, which is connected to the gate 211 of first transistor 209. Second transistor 231 is controlled by second control circuit 271 through resistor 270, which is connected to the gate 233 of second transistor 231.

When first control circuit 273 decreases voltage to the gate 211 of first transistor 209 through resistor 272, the current flowing from power supply 222 through first fuse 355, from drain 215 to source 213 of the first transistor 209 through the inductive load 229 to ground 202 will decrease. This will cause the voltage across the inductive load 229 to decrease to a negative value. The voltage at the source 213 of the first transistor 209 will decrease, as will the voltage at the gate 211 of first transistor 209. The voltage at the gate 211 of first transistor 209 will decrease only to the level at which the first power clamp steering diode 323 is forward biased, zener diode 207 breaks down and the first clamp voltage steering diode 217 is forward biased.

As in the circuits of FIG. 1 and FIG. 2 a feedback system is formed—a decrease in current through the first transistor 209 and inductive load 229 will tend to decrease the voltage at the first transistor's source 213 and increase the voltage between the first transistor's gate 211 and source 213. But, this increase of voltage between the first transistor's gate 211 and source 213 tends to increase current through the first transistor 209 and the inductive load 229. Because of the high transconductance of the first transistor 209, the net result is that the voltage at the source 213 will not go more than a few volts below the voltage at the drain 215 minus the zener diode's 203 breakdown voltage.

The voltage across the second transistor 231 is clamped by second power clamp steering diode 345, zener diode 203 and second clamp voltage steering diode 239 in the same manner that the first transistor 209 is clamped by first power clamp steering diode 323, zener diode 203 and first clamp voltage steering diode 217. The signal at the anode of zener diode 205 is 'shared' by each clamp voltage steering diode 217 and 239.

In combination the power clamp diodes 323 and 345, and the surge suppression device 307 replaces the function of the earlier described power supply terminal 201—that is to provide a reference voltage node at the anode 207 of zener diode 203.

Although the embodiments illustrated show field effect transistors other transistors including bipolar and IGBT (Isolated Gate Bipolar Transistors) can be used in the same configuration.

Figure 4:
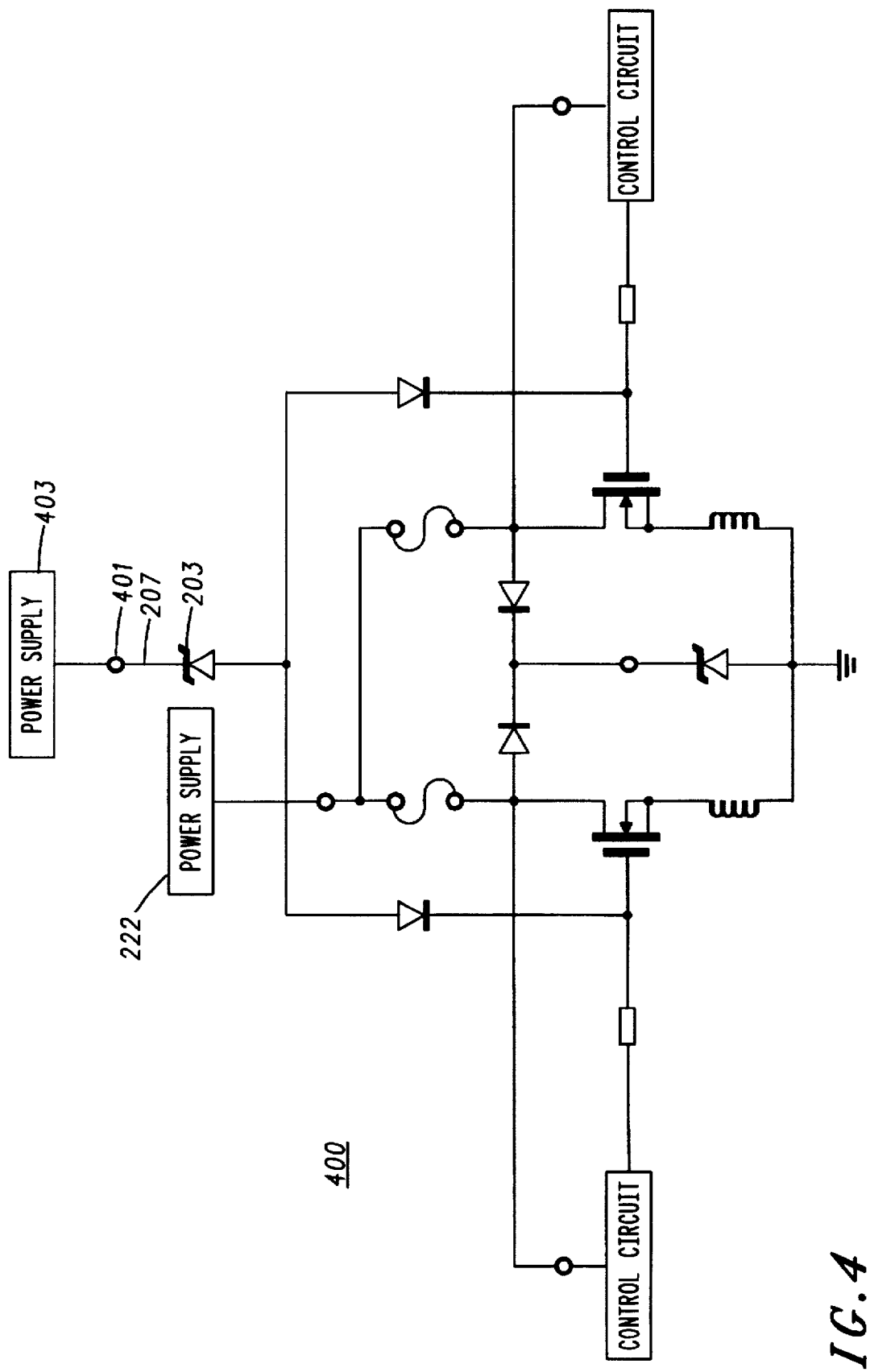
FIG. 4 is a schematic block diagram illustrating a driver circuit in accordance with an alternative embodiment of the invention.

FIG. 4 is a schematic block diagram illustrating a driver circuit 400 in accordance with an alternative embodiment of the invention. In the illustrated embodiment the cathode 207 of the zener diode 203 is coupled to a clamp terminal 401. The clamp terminal 401 is coupled to a second power supply 403. The second power supply 403 outputs another voltage to control the flyback clamping of the circuit 400. This voltage can be the same voltage as output from the power supply 222, it could be circuit ground, or any other voltage.

In conclusion, an improved driver circuit for driving multiple inductive loads has been detailed. Because the improved driver circuit uses a single device (zener diode 203) to effect the flyback clamping action of multiple drivers, this circuit is simpler, smaller, and more reliable than prior art circuits.

What is claimed is:

1. A shared flyback protection driver circuit for driving a plurality of inductive loads comprising:

a zener diode (203) having a first terminal and a second terminal;

a first transistor (209) including an output terminal coupled to a first of the plurality of inductive loads and an input terminal (211);

a first clamp voltage steering diode (217) coupled between the input terminal (207) of the first transistor (209), and the first terminal of the zener diode (203);

a second transistor (231) including an output terminal coupled to a second of the plurality of inductive loads and an input terminal (233);

a second clamp voltage steering diode (239) coupled between the input terminal (233) of the second transistor (231), and the first terminal of the zener diode (203); and a power supply coupled to and for providing power to each of the first and second transistors, and coupled to the second terminal of zener diode (203).

2. A shared flyback protection driver circuit in accordance with claim 1 further comprising a power supply outputting a voltage, the power supply coupled to and supplying the voltage to the power supply terminal.

3. A shared flyback protection driver circuit in accordance with claim 1 further comprising:

a first load (229) coupled to the first transistor (209); and a second load (251) coupled to the second transistor (231).

4. A shared flyback protection driver circuit in accordance with claim 1 wherein the first transistor is a field effect transistor, the input terminal of the first transistor is a gate, and the output terminal of the first transistor is a source.

5. A shared flyback protection driver circuit in accordance with claim 1 wherein the zener diode comprises two terminals, and wherein the coupling between the first clamp voltage steering diode and the zener diode is oriented at a first of the two terminals, and the coupling between the power supply terminal and the zener diode is oriented at a second of the two terminals.

6. A shared flyback protection driver circuit for driving a plurality of inductive loads comprising:

a power supply with an output terminal (353) providing power;

a ground terminal (202);

a zener diode (203) having a cathode (207) coupled to the output terminal of the power supply, and an anode (205);

a first transistor (209) including an output terminal coupled to a first of the plurality of inductive loads and an input terminal (211), the first transistor coupled to the output terminal of the power supply for receiving the provided power;

a first clamp voltage steering diode (217) coupled between the input terminal (207) of the first transistor (209), and the anode (205) of the zener diode (203);

a second transistor (231) including an output terminal coupled to a second of the plurality of inductive loads and an input terminal (233), the second transistor coupled to the output terminal of the power supply for receiving the provided power;

a second clamp voltage steering diode (239) coupled between the input terminal (233) of the second transistor (231), and the anode (205) of the zener diode (203).

7. A shared flyback protection driver circuit in accordance with claim 6 further comprising a power supply outputting a voltage, the power supply coupled to and supplying the voltage to the power supply terminal.

8. A shared flyback protection driver circuit in accordance with claim 7 further comprising:

a first load (229) coupled to the first transistor (209); and a second load (251) coupled to the second transistor (231).

9. A shared flyback protection driver circuit in accordance with claim 7 wherein the first transistor is a field effect transistor, the input terminal of the first transistor is a gate, and the output terminal of the first transistor is a source.

10. An inductive load driver circuit with shared flyback protection comprising:

a power supply terminal;

a ground terminal;

a zener diode with a cathode connected to the power supply terminal and an anode;

a first transistor including an input terminal, an output terminal, and another terminal;

a first clamp voltage steering diode having a cathode connected to the input terminal of the first transistor, and an anode connected to the anode of the zener diode;

a first power clamp diode having an anode connected to the another terminal of the first transistor, and a cathode connected to the power supply terminal;

a first load connected between the output terminal of the first transistor and the ground terminal;

a second transistor including an input terminal, an output terminal, and another terminal;

a second clamp voltage steering diode having a cathode connected to the input terminal of the second transistor, and an anode connected to the anode of the zener diode;

a second power clamp diode having an anode connected to the another terminal of the second transistor, and a cathode connected to the power supply terminal; and a second load connected between the output terminal of the second transistor and the ground terminal.

11. An inductive load driver circuit in accordance with claim 10 further comprising a power supply outputting a voltage, the power supply coupled to and supplying the voltage to the power supply terminal.

12. An inductive load driver circuit in accordance with claim 10 wherein the first transistor is a field effect transistor, the input terminal of the first transistor is a gate, and the output terminal of the first transistor is a source.

13. An inductive load driver circuit in accordance with claim 10 further comprising a surge suppression device coupled between the power supply terminal and the ground terminal.

14. An inductive load driver circuit in accordance with claim 12 further comprising a surge suppression device coupled between the power supply terminal and the ground terminal.

15. An inductive load driver circuit with shared flyback protection comprising:

a power supply terminal;

a clamp terminal;

a ground terminal;

a zener diode with a cathode connected to the clamp terminal and an anode;

a first transistor including an input terminal, an output terminal, and another terminal;

a first clamp voltage steering diode having a cathode connected to the input terminal of the first transistor, and an anode connected to the anode of the zener diode;

a first power clamp diode having an anode connected to the another terminal of the first transistor, and a cathode connected to the power supply terminal;

a first load connected between the output terminal of the first transistor and the ground terminal;

a second transistor including an input terminal, an output terminal, and another terminal;

a second clamp voltage steering diode having a cathode connected to the input terminal of the second transistor, and an anode connected to the anode of the zener diode;

a second power clamp diode having an anode connected to the another terminal of the second transistor, and a cathode connected to the power supply terminal; and a second load connected between the output terminal of the second transistor and the ground terminal.

16. An inductive load driver circuit in accordance with claim 15 further comprising a power supply outputting a voltage, the power supply coupled to and supplying the voltage to the power supply terminal.

17. An inductive load driver circuit in accordance with claim 15 wherein the first transistor is a field effect transistor, the input terminal of the first transistor is a gate, and the output terminal of the first transistor is a source.

18. An inductive load driver circuit in accordance with claim 15 further comprising a surge suppression device coupled between the power supply terminal and the ground terminal.

19. An inductive load driver circuit in accordance with claim 15 further comprising a second power supply outputting another voltage, the second power supply coupled to and supplying the another voltage to the clamp terminal.

20. An inductive load driver circuit in accordance with claim 16 wherein the first transistor is a field effect transistor, the input terminal of the first transistor is a gate, the output terminal of the first transistor is a source, and the another terminal is a drain.

21. An inductive load driver circuit in accordance with claim 16 further comprising a surge suppression device coupled between the power supply terminal and the ground terminal.

22. An inductive load driver circuit in accordance with claim 21 further comprising a second power supply outputting another voltage, the second power supply coupled to and supplying the another voltage to the clamp terminal.

* * * * *